United States Patent [19]
Yun

[11] Patent Number: 5,440,433
[45] Date of Patent: Aug. 8, 1995

[54] CIRCUIT AND METHOD FOR ADJUSTING A DATA DETECTING LEVEL OF A DISK DRIVING APPARATUS

[75] Inventor: Jong-Yun Yun, Suwon, Rep. of Korea

[73] Assignee: SamSung Electronics Co., Ltd., Kyungki-do, Rep. of Korea

[21] Appl. No.: 126,718

[22] Filed: Sep. 27, 1993

[30] Foreign Application Priority Data

Nov. 27, 1992 [KR] Rep. of Korea ............... 22634/1992

[51] Int. Cl.$^6$ ............................................. G11B 5/09
[52] U.S. Cl. ..................................................... 360/46
[58] Field of Search ..................... 360/46, 51, 32, 53; 307/351, 355; 375/22, 20; 358/335

[56] References Cited

U.S. PATENT DOCUMENTS

| | | | |
|---|---|---|---|
| 3,509,549 | 4/1970 | Ohta | 340/174.1 |
| 4,063,199 | 12/1977 | Oursler; Jr. | 332/41 |
| 4,112,368 | 9/1978 | Ewanus et al. | 375/22 X |
| 4,178,549 | 12/1979 | Ledenbach et al. | 325/38 R |
| 4,322,760 | 3/1982 | Hardwick | 360/77 |
| 4,550,307 | 10/1985 | Akashi | 340/347 |
| 4,562,549 | 12/1985 | Tanaka | 364/486 |
| 4,644,422 | 2/1987 | Bedini | 360/60 |
| 4,713,521 | 12/1987 | Eldridge | 219/130.5 |
| 4,771,188 | 9/1988 | Cheng et al. | 307/351 |
| 5,003,408 | 3/1991 | Farkas | 360/51 |
| 5,091,725 | 2/1992 | Gard | 375/22 X |
| 5,121,260 | 6/1992 | Asakawa | 360/25 X |
| 5,121,262 | 6/1992 | Squires et al. | 360/46 |
| 5,128,629 | 7/1992 | Trinh | 330/129 |
| 5,134,632 | 7/1992 | Fletcher et al. | 375/22 |
| 5,144,265 | 9/1992 | Petzold | 375/22 X |
| 5,150,050 | 9/1992 | Genheimer et al. | 324/212 |
| 5,194,965 | 3/1993 | Quan | 358/335 |
| 5,198,785 | 3/1993 | Jordan | 375/22 X |
| 5,287,063 | 2/1994 | Izawa | 375/351 X |

Primary Examiner—Donald Hajec
Assistant Examiner—Le Thien Minh
Attorney, Agent, or Firm—Robert E. Bushnell

[57] ABSTRACT

A circuit and method for variably adjusting a data detecting level by using a pulse with modulation (PWM) signal. The pulse width modulation (PWM) signal having duty corresponding to a predetermined level control value is generated, and the level of the pulse width modulation (PWM) signal is detected to determine the data detecting level to a level corresponding to the detected level. A read test is performed while the level control value is incremented by a given stage from an initial level control value in response to a test mode, to determine the level control value less than that generating a data error by one stage to a maximum value. Further, the read test is implemented while the level control value is decremented by a given stage from the initial level control value, to determine the level control value greater than that generating the data error by one stage to a minimum value. Thus the initial level control value or level control value is obtained by an average value of the maximum and minimum level values. Therefore, the data detecting level adapted for each disk driving apparatus can be adjusted without modifying hardware of each disk driving apparatus, and the data error can be prevented by adaptively adjusting the data detecting level to operating circumstances.

17 Claims, 8 Drawing Sheets

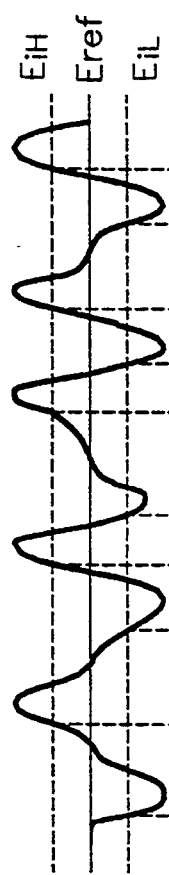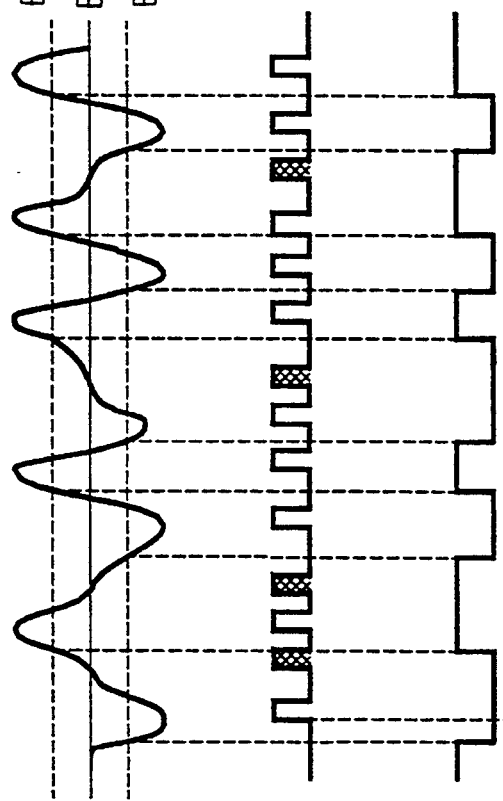
FIG. 2A  FIG. 2B  FIG. 2C  FIG. 2D  FIG. 2E FIG. 3A
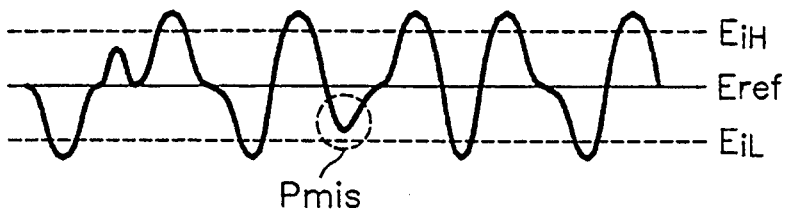
FIG. 3B
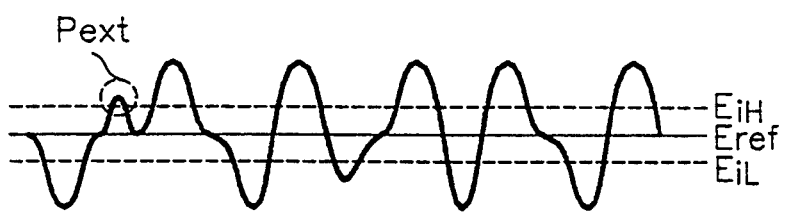
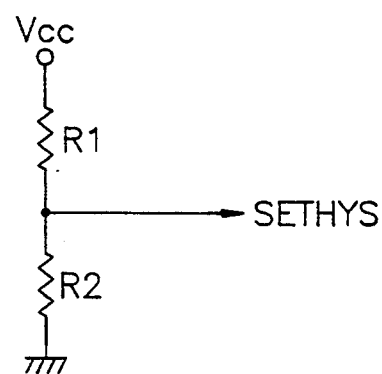
(PRIOR ART)
FIG. 4

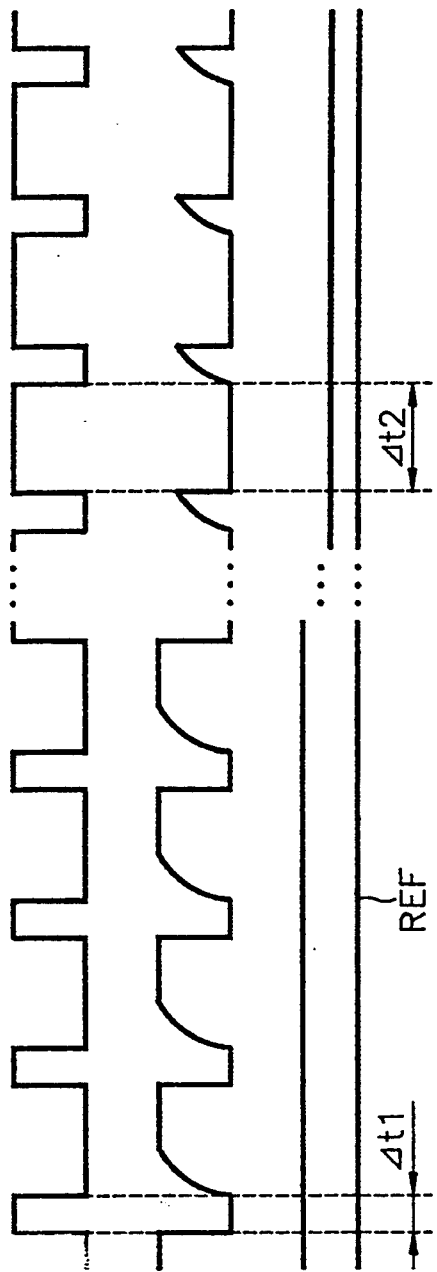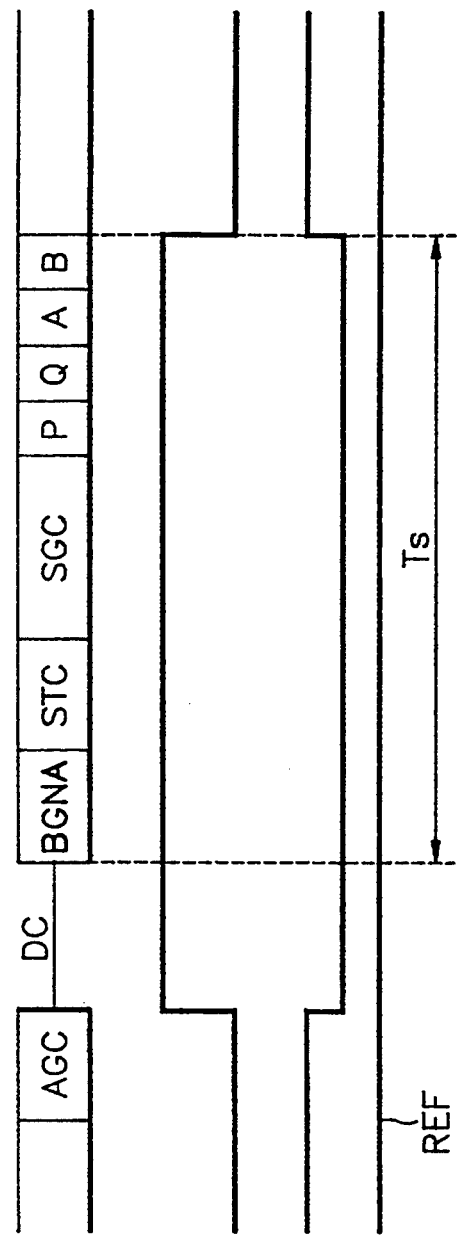

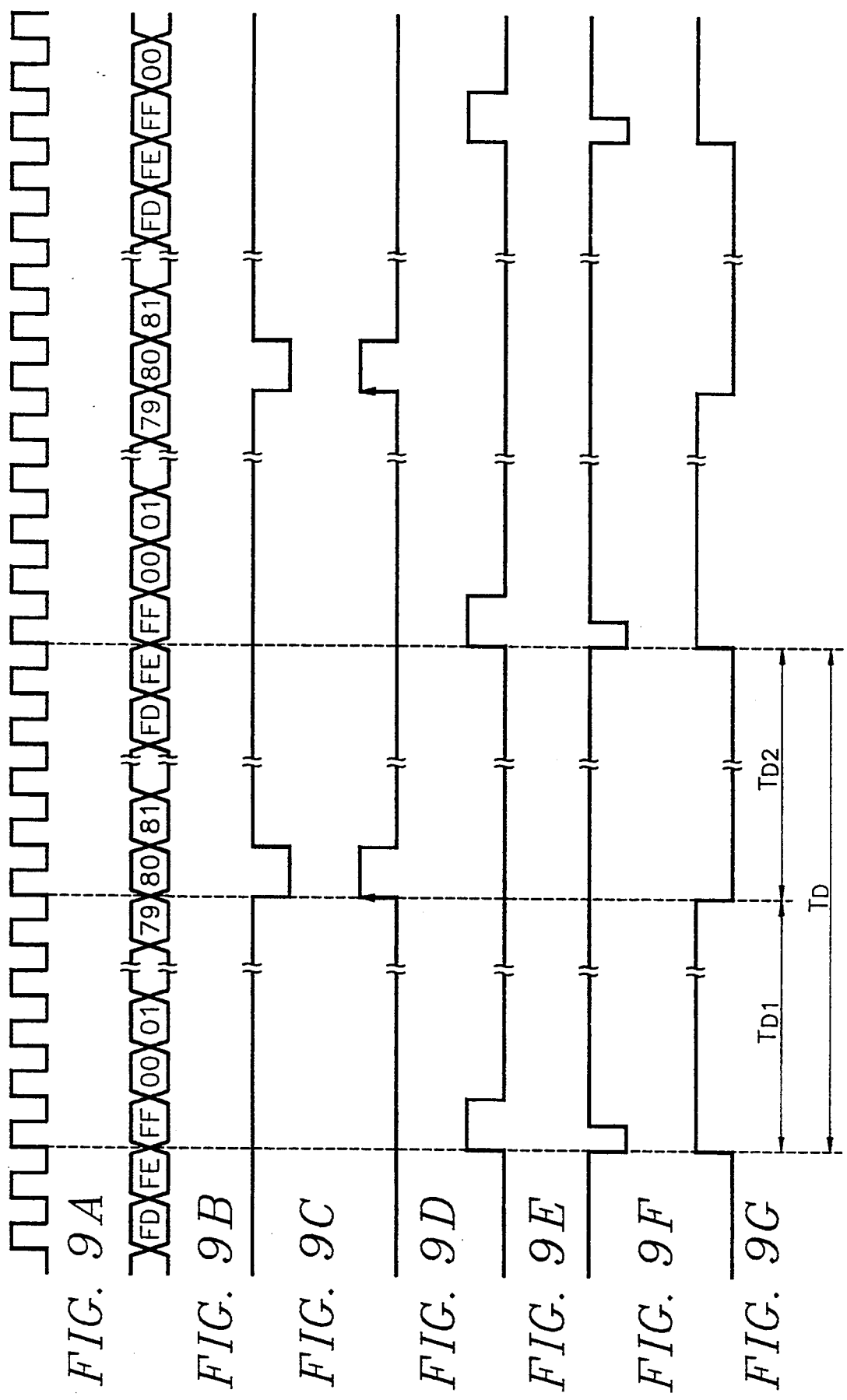

CIRCUIT AND METHOD FOR ADJUSTING A DATA DETECTING LEVEL OF A DISK DRIVING APPARATUS

BACKGROUND OF THE INVENTION

The present invention relates to a circuit and method for adjusting a data detecting level of a disk driving apparatus, and more particularly, to a circuit and method for variably adjusting the data detecting level.

Generally, disk driving apparatus such as a hard disk drive, a floppy disk drive, etc. is widely used as an auxiliary memory of a computer system. Disk driving apparatus record data only a hard disk or a floppy disk, for example, and read the recorded data. In reading the recorded data, a signal picked up by a head of the disk driving apparatus is hysteresis-compared with a predetermined data detecting level in a read processing circuit, in order to detect the data.

In one typical contemporary design of a circuit, a signal picked up from a disk by read heads of a disk driving apparatus is amplified, filtered, and simultaneously applied to a differentiator and rectifier circuit. The rectifier circuit detects the voltage level of a signal by full-wave rectifying the filtered signal and the voltage level detected is applied to automatically control gain control gain of a control amplifier. The differentiator detects the peak value of the signal by differentiating the filtered signal. A pulse signal is generated in response to the peak value detected by the differentiator. The differentiator may however, undesirably provide false output data when, for example, the filtered signal contains noise. In order to prevent output of false output and to restrict detection to only data exhibiting the peak value, the differential comparator hysteresis-compares the filtered signal with a predetermined data detecting level SETHYS provided by a data detecting level adjusting circuit. A differential amplifier generates a signal in response to the filtered signal. A flip-flop generates a signal by latching the output signal from the differential comparator at a rising edge of the signal generated from the first bidirectional monostable multivibrator. Then, a second bidirectional monostable multivibrator is triggered at the rising and falling edges of the signal provided by the flip-flop to produce a pulse signal. When comparing the filtered signal with the pulse signal, only the peak value is detected. Hence, the pulse signal generated from the second bidirectional monostable multivibrator is produced as data.

Actually, the signal picked up by the heads varies depending upon operating circumstances such as the interference, impact, noise of the signal, and the like. In particular, as the capacity of the disk increases, the recording information of the disk is highly packed; and as the number of tracks increases, the signal is severely varied. Therefore, if the data detecting level is inappropriately given, a data error is generated. That is, if the data detecting level is too high, a data loss part $P_{mis}$ occurs, and if the data detecting level is too low, a data noise part $P_{ext}$ is detected. Thus, in consideration of the variation of the signal, the data detecting level must be set to an appropriate value by the data detecting level adjusting circuit.

In one example of a conventional data detecting level adjusting circuit, the data detecting level is adjusted by using a resistance voltage divider to divide a supply voltage Vcc to a uniform value. The resistances of the divider are selected so as to provide an appropriate data detecting level.

Meanwhile, the size of the signal picked-up by the head in the disk driving apparatus also differs as a function of the position of the disk and each disk driving apparatus. Since the data detecting level adjusting circuit has one fixed data detecting level, different resistances must be selected for different apparatus. Hence, each disk driving apparatus must be modified in its hardware, and it is difficult to prevent the data error caused by the variation of the signal according to the position of the disk, or operating circumstances.

In order to solve such disadvantages, a technique disclosed in Korea Patent Application No. 92-22630 assigned to the same assignee of the present invention, uses selection of three predetermined data detecting levels. Thus, during a test process when manufacturing the disk driving apparatus, the data detecting level is varied in response to the area of the disk and simultaneously a sector or a data interval in which an error occurs is mapped to a defect list. Then, when a user operates the disk driving apparatus, the data error caused by the variation of the signal by the defect of the disk is prevented. Korean Patent Application No. 92-22630 however, has problems in that hardware must be modified as a function of each apparatus because the data detecting level is still fixed; moreover, it is difficult to prevent the data error caused by the variation of the signal by operating circumstances.

In U.S. Pat. No. 5,150,050 for Adaptive Variable Threshold Qualification Level Circuit For Signal Processing In Disk Drives by Stephen R. Genheimer and Steven L. Welty, a microprocessor generates a qualification level signal by retrieveing selected optimal qualification level signal data from its memory, or alternatively, by interpolation. A qualificaton level generator provides a variable qualification level signal, while a threshold detector receiving a raw data signal ostensibly representative of data to be read from a magnetic disk through relative movement between a magnetic transducer and addressible portions of the disk, compares the raw data signal to the qualification level signal in an effort to detect amplitude errors when the raw data signal does not meet the qualification level. When an amplitude error signal is detected, the microprocessor varies the qualification level signal as a function of whether a low amplitude read error or an extra amplitude error is detected, and causes data stored on the on the addressible portions of the disk to be re-read once the microprocessor has varied the qualification level signal. In this process however, it is necessary to first map defects of the magnetic disk using a variable qualification level signal, identifying errors caused by reduced signal amplitude by setting the qualification level signal to a desired level above the normal qualification level for the specific track and errors caused by extra amplitude by setting the qualification level signal to a desired level below the normal operational level, and mapping the errors detected into a memory of the controller. Moreover, it has been my observation that in this circuit, the qualification level signal is, in essence, a constant value relative to each track.

SUMMARY OF THE INVENTION

It is accordingly an object of the present invention to provide an improved data detecting level adjusting circuit and process.

It is another object to provide a data detecting level adjusting circuit and method capable of preventing data error by variably adjusting a data detecting level without modifying the hardware in a disk driving apparatus.

It is still another object of the present invention to provide a data detecting level adjusting circuit and method capable of variably adjusting a data detecting level by using a pulse width modulated signal having a data code corresponding to a predetermined level control value.

It is a further object of the present invention to provide a data detecting level adjusting circuit and method capable of preventing data error by adaptively adjusting a data detecting level in dependence upon operating circumstances such as noise, interference, impact and alike.

These and other objects may be achieved in accordance with one aspect of the present invention, with a circuit and process for adjusting a data detecting level in a disk driving apparatus having a level controlling circuit for generating a pulse width modulation (PWM) signal exhibiting a duty cycle corresponding to a predetermined level control value; and a level determining circuit for detecting the level of the pulse width modulation (PWM) signal generated from the level controlling circuit and determining a level corresponding to the detected level to the data detecting level.

In accordance with another aspect of the present invention, a method for adjusting a data detecting level in a disk driving apparatus comprises: a maximum level checking process for performing a read test while a level control value is incremented by a given stage from an initial level control value in response to a test mode, and checking whether if there is data error; a maximum level determining process for determining a level control value less than that generating the data error in the maximum level checking process by one stage to a maximum value; a minimum level checking process for performing the read test while the level control value is decremented by a given stage from the initial level control value, and checking whether if there is data error; a miniature level determining process for determining a level control value greater than that generating the data error in the minimum level checking process by one stage to a minimum value; and a control value determining process for determining an average value of the maximum and minimum level values to the initial level control value.

BRIEF DESCRIPTION OF THE DRAWINGS

The advantages and features of the present invention will be more apparent from the detailed description hereunder, with reference to the attached drawings, in which:

FIGS. 2A to 2E are waveform charts at each part of the block diagram shown in FIG. 1;

FIGS. 3A and 3B are waveform charts showing data errors in response to the variation of a data detecting level of FIG. 1;

FIG. 4 is a circuit diagram of a data detecting level setting circuit of FIG. 1;

FIGS. 6A to 6C are waveform charts at each part of the circuit of FIG. 5;

FIGS. 7A to 7C are charts illustrating the variation of a data detecting level in response to a servo synchronizing signal of FIG. 5;

FIGS. 9A to 9G are waveform charts at each part of the circuit of FIG. 8;

DETAILED DESCRIPTION OF THE PREFERRED EMBODIMENT

Figure 1:
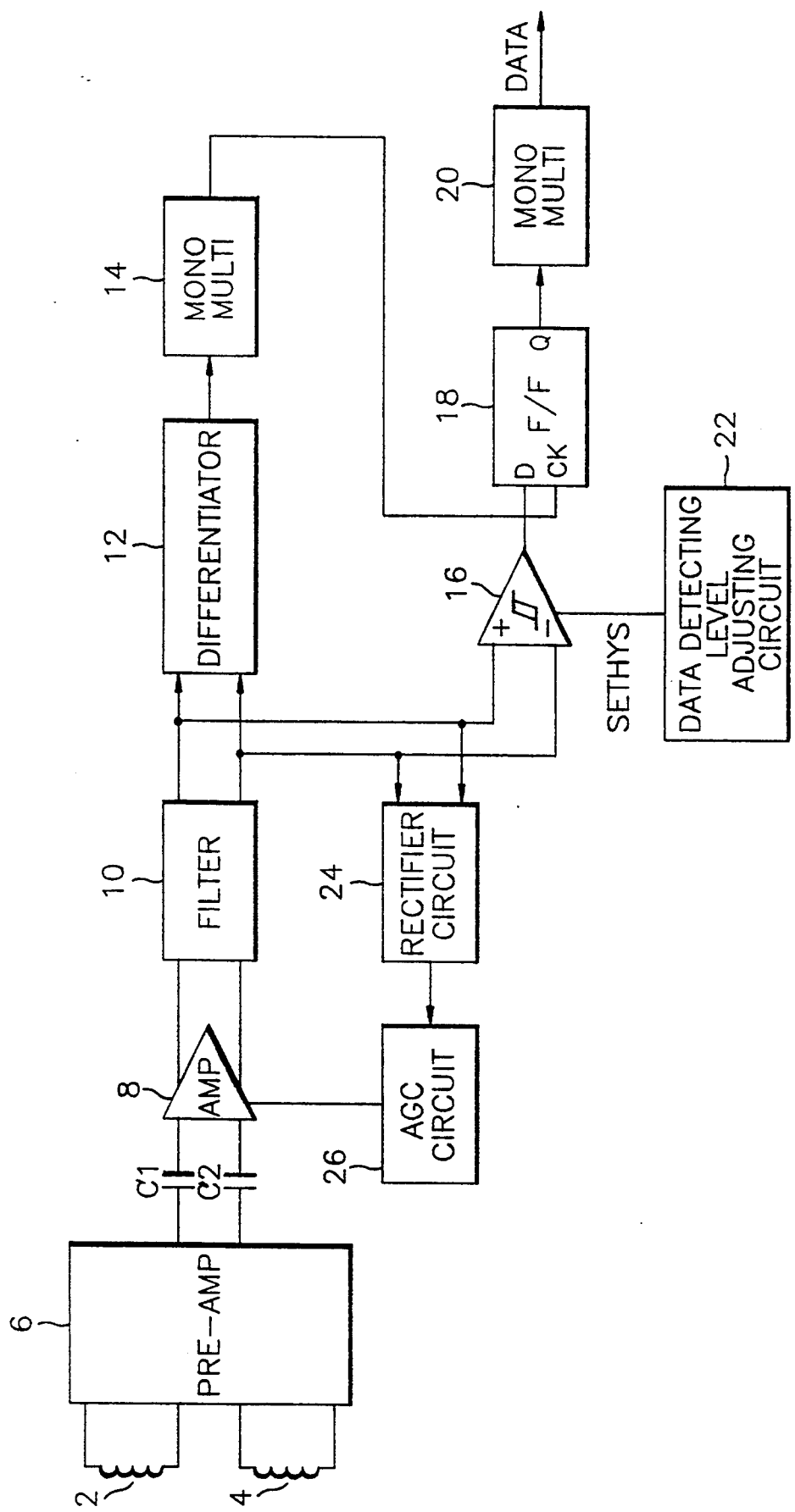
FIG. 1 is a block diagram of a read processing circuit of a general disk driving apparatus.

Turning now to the drawings, FIG. 1 is a block diagram of the read processing circuit for a conventional disk driving apparatus. An integrated circuit, such as a read processor "DP8464" manufactured by the National Semiconductor in the United States may be used for a gain control amplifier 8, a filter 10, a differentiator 12, first and second bidirectional monostable multivibrators 14 and 20, a differential comparator 16, a flip-flop 18, a rectifier circuit 24 and an automatic gain control circuit 26.

A data detecting operation will now be described with reference to FIG. 1. A signal picked up from a disk by read heads 2 and 4 of a disk driving apparatus is preamplified in a pre-amplifier 6 and further gain control amplified in the gain control amplifier 8 through capacitors $C_1$ and $C_2$. Thereafter, the signal passing through the filter 10 is simultaneously applied to the differentiator 12, the differential comparator 16 and the rectifier circuit 24. The waveform chart of the output signal of the filter 10 is illustrated in FIG. 2A. The rectifier circuit 24 detects the voltage level of a signal by full-wave rectifying the output signal of the filter 10 and supplies the detected voltage level to the automatic gain control circuit 26. The automatic gain control circuit 26 controls the gain of the gain control amplifier 8 appropriately in response to the voltage level detected from the rectifier circuit 24. The differentiator 12 detects the peak value of the signal by differentiating the output signal of the filter 10. The first bidirectional monostable multivibrator 14 generates a pulse signal shown in FIG. 2B in response to the peak value detected from the differentiator 12. In this case, the differentiator 12 may generate false output when noise is contained in the output signal of the filter 10. In order to prevent false output and detect only data of the peak value, the differential comparator 16 hysteresis-compares the output signal of the filter 10 with a predetermined data detecting level. At this time, the predetermined data detecting level by a data detecting level adjusting circuit 22 becomes a hysteresis level SETHYS of the differential comparator 16. The differential amplifier 16 generates a signal shown in FIG. 2C in response to the output signal of the filter 10. The flip-flop 18 generates a signal indicated in FIG. 2D by latching the output signal of the differential comparator 16 at a rising edge of the signal generated from the first bidirectional monostable multivibrator 14. Then the second bidirectional monostable multivibrator 20 is triggered at the rising and falling edges of the signal generated from the flip-flop 18, to produce a signal shown in FIG. 2E. When comparing the pulse signal shown in FIG. 2E with the signal shown in FIG. 2A, only the peak value is detected. Hence, the pulse signal generated from the second bidirectional monostable multivibrator 20 is produced as data.

Actually, the signal picked up by the heads 2 and 4 is varied as shown in FIGS. 3A and 3B dependent upon operating circumstances such as the interference, impact, noise of the signal, and the like. In particular, as the capacity of the disk increases, the recording information of the disk is highly packed; and as the number of tracks increases, the signal is severely varied. Therefore, if the data detecting level is inappropriately given, a data error is generated. That is, if the data detecting level is too high, a data loss part $P_{mis}$ occurs as indicated in FIG. 3A, and if the data detecting level is too low, a data noise part $P_{ext}$ is detected as indicated in FIG. 3B. Thus, in consideration of the variation of the signal, the data detecting level must be set to an appropriate value by the data detecting level adjusting circuit 22.

One example of the conventional data detecting level adjusting circuit is illustrated in FIG. 4. The data detecting level is adjusted by dividing a supply voltage Vcc to a uniform voltage by the use of resistors $R_1$ and $R_2$. The resistances of the resistors $R_1$ and $R_2$ are selected so as to provide an appropriate data detecting level.

Meanwhile, the size of the signal picked-up by the head in the disk driving apparatus is different depending on the position of the disk and each disk driving apparatus. However, since the data detecting level adjusting circuit shown in FIG. 4 has one fixed data detecting level, different resistances must be selected in accordance with different apparatus. Hence, each disk driving apparatus must be modified in its hardware, and in the case of the data detecting level adjusting circuit shown in FIG. 4, it is difficult to prevent the data error caused by the variation of the signal according to the position of the disk, or operating circumstances.

In the prior art in order to solve such disadvantages, three data detecting levels are predetermined so as to select any one of the three as disclosed in Korea Patent Application No. 92-22630, assigned to the same assignee of the present invention. Thus, during a test process when manufacturing the disk driving apparatus, the data detecting level is varied in response to the area of the disk and simultaneously a sector or a data interval in which an error occurs is mapped to a defect list. Then, when a user operates the disk driving apparatus, the data error caused by the variation of the signal by the defect of the disk is prevented.

However, the aforementioned Patent Application No. 92-22630 has problems in that hardware must be modified depending on each apparatus because the data detecting level is still fixed, and it is difficult to prevent the data error caused by the variation of the signal by operating circumstances.

Figure 5:
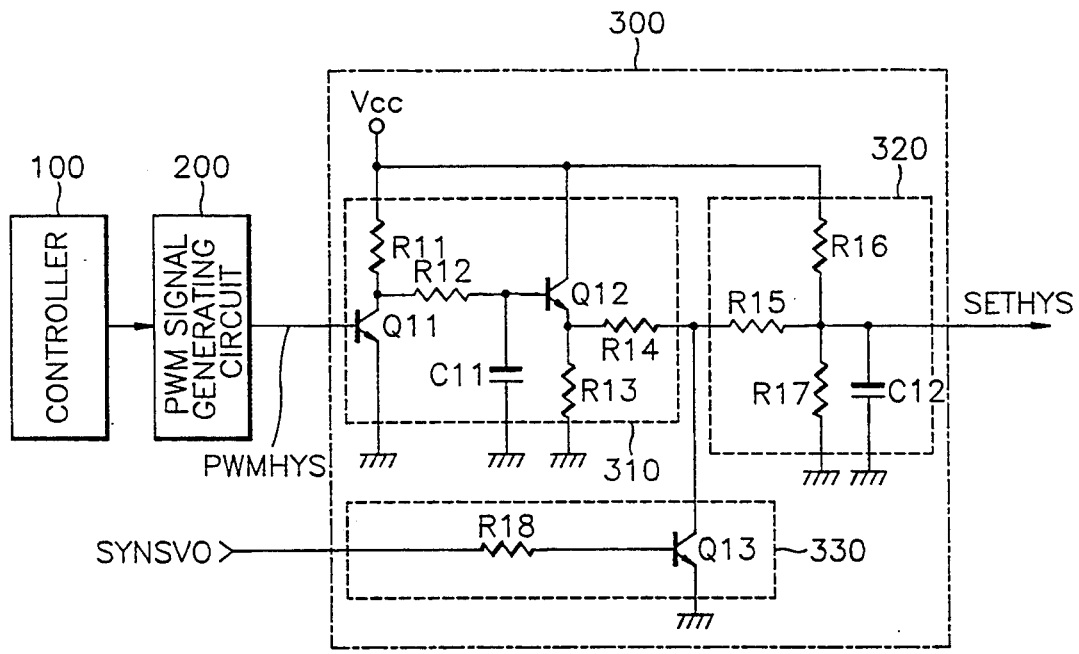
FIG. 5 is a circuit diagram of a data detecting level adjusting circuit constructed according to the principles of the present invention.
Figure 10:
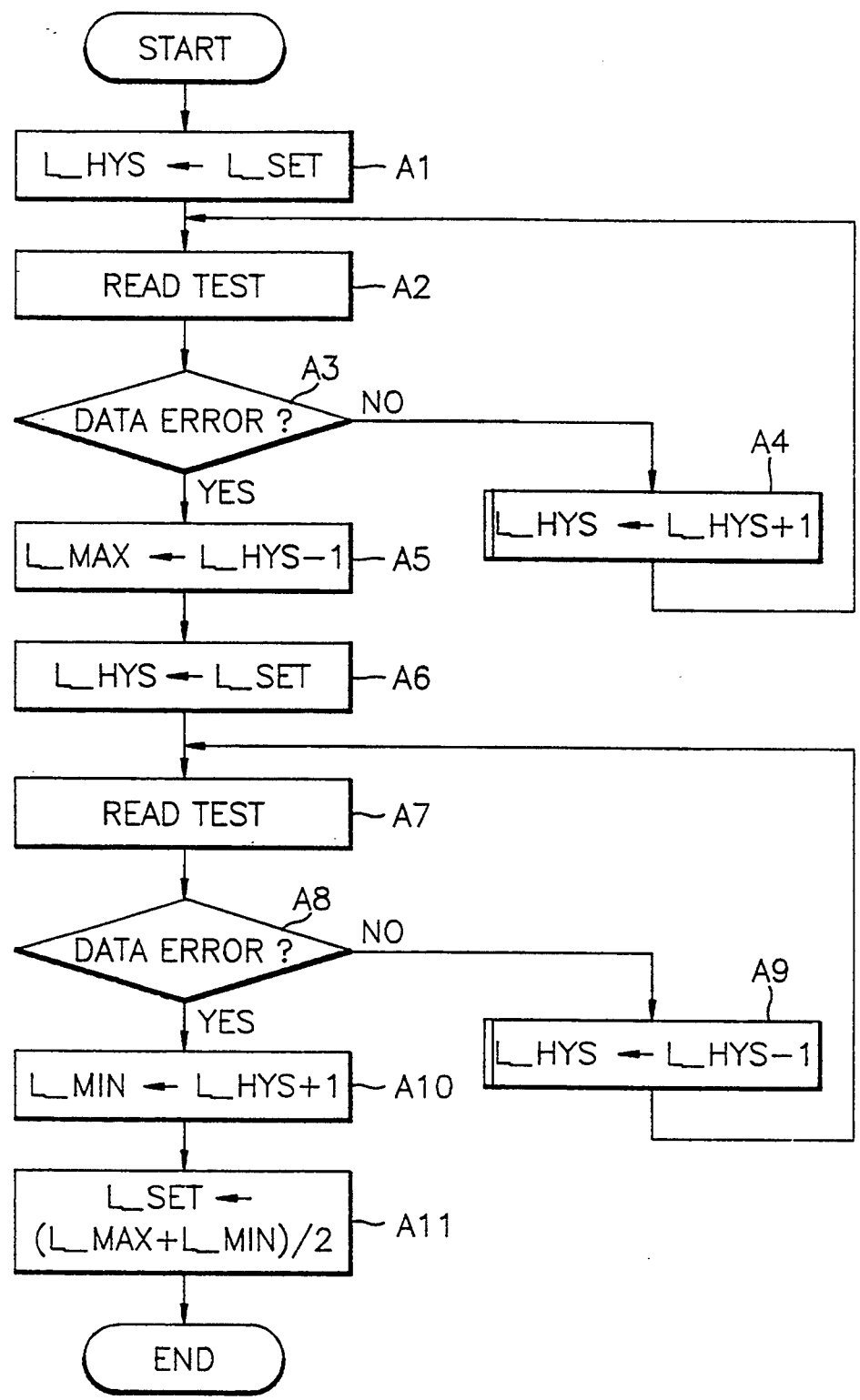
FIG. 10 is a flow chart showing processes for adjusting a data detecting level according to one embodiment of the present invention.
Figure 11:
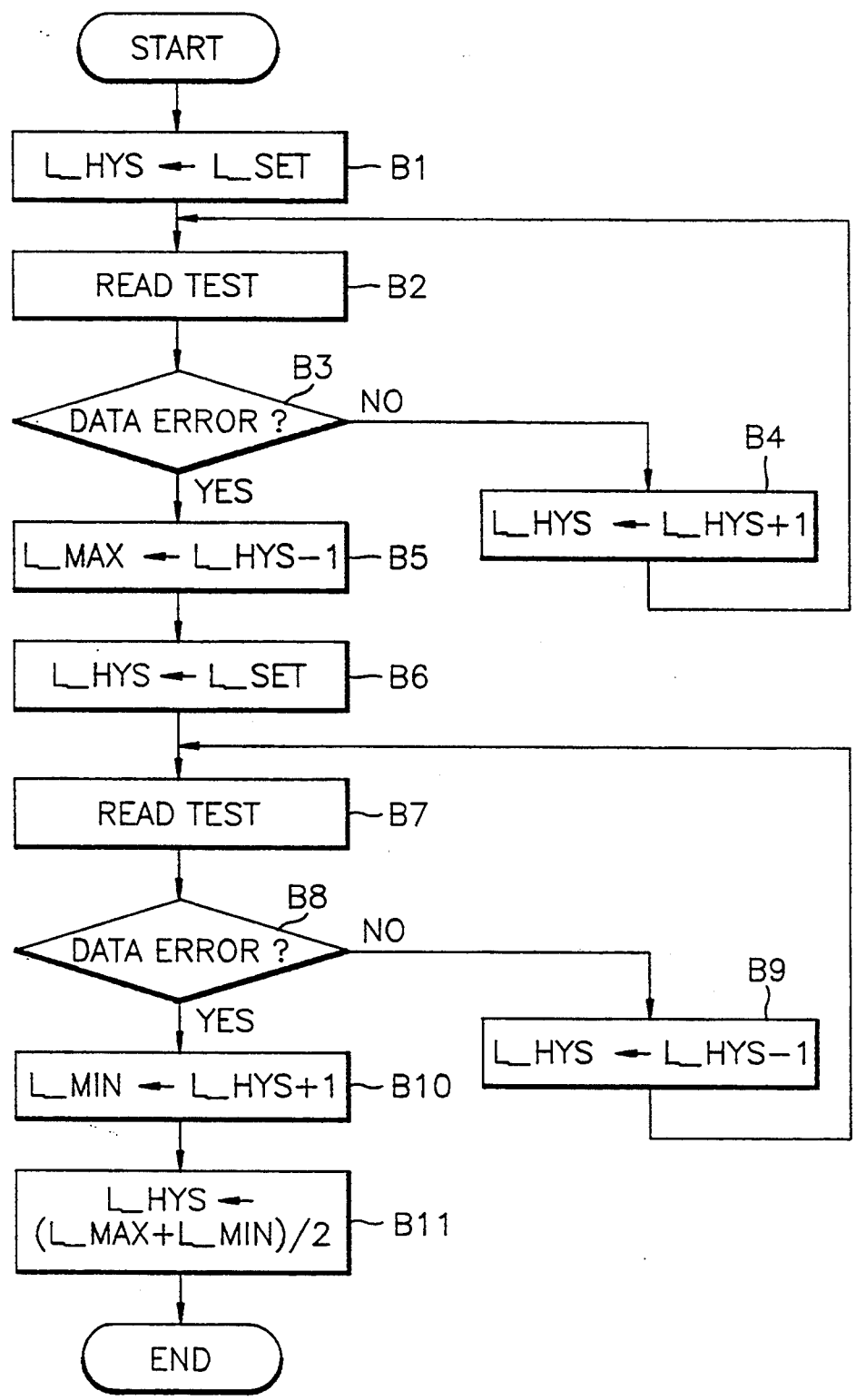
FIG. 11 is a flow chart showing processes for adjusting a data detecting level according to another embodiment of the present invention.

Referring now to FIG. 5, a controller 100 generates level control data having a predetermined value and performs a data detecting level adjusting function as shown in FIG. 10 or 11, which will be described later on, by the use of a typical control unit or an additional one chip microcomputer used for controlling the disk driving apparatus. A PWM signal generating circuit 200 generates a PWM signal PWMHYS having a duty cycle corresponding to the level control data of the controller 100. A level determining circuit 300 detects the voltage level of the PWM signal PWMHYS and provides the data detecting level corresponding to the detected voltage level to the differential comparator 16 of FIG. 1 as a hysteresis level SETHYS. The level determining circuit 300 includes a level detecting circuit 310 consisting of transistors $Q_{11}$ and $Q_{12}$, resistors $R_{11}$-$R_{13}$ and a capacitor $C_{11}$, a superposing circuit 320 having resistors $R_{15}$-$R_{17}$ and a capacitor $C_{12}$, and a servo read controlling circuit 330 having a transistor $Q_{13}$ and a resistor $R_{18}$. The level detecting circuit 310 smooths the PWM signal PWMHYS to detect a direct current (DC) voltage level, and the superposing circuit 320 superposes the DC voltage level detected from the level detecting circuit 310 with a fixedly set DC voltage level. The servo read controlling circuit 330 generates only the fixedly set DC voltage level as the data detecting level by cutting off the DC voltage level detected from the level detecting circuit 310 from applying to the superposing circuit 320, in response to a servo synchronizing signal SYNSVO indicative of a servo information interval.

FIGS. 6A to 6C illustrate the variation of the data detecting level when the duty cycle of the PWM signal PWMHYS is varied.

FIGS. 7A to 7C illustrate the variation of the data detecting level in response to the servo synchronizing signal SYNSVO when servo and data information intervals from a disk are read.

An operation of the circuit of FIG. 5 will now be described in detail with reference to FIGS. 6A to 6C and FIGS. 7A to 7C. If the controller 100 generates the level control data having a predetermined value, the PWM signal generating circuit 200 produces the PWM signal PWMHYS having the duty cycle corresponding to the level control data as shown in FIG. 6A. The PWM signal PWMHYS is inverted by the transistor $Q_{11}$ of the level detecting circuit 310 as indicated in FIG. 6B and smoothed by the resistors $R_{11}$, $R_{12}$ and the capacitor $C_{11}$. Hence, the DC voltage level corresponding to the level of the PWM signal PWMHYS is detected. In order to stabilize the smoothed voltage, the time constant caused by the resistors R11, R12 and the capacitor CII is appropriately selected in consideration of the period of the PWM signal PWMHYS. The detected DC voltage level is applied to the base of the transistor $Q_{12}$. In the emitter of the transistor $Q_{12}$, the DC voltage level inversely proportional to the duty cycle of the PWM signal PWMHYS is generated as shown in FIG. 6C. For descriptive convenience, the duty cycle of the PWM signal PWMHYS varied to $\Delta t_1$ or $\Delta t_2$ is illustrated in FIGS. 6A to 6C. However, if necessary, the duty cycle of the PWM signal PWMHYS can be varied to multiple stages. The DC voltage level generated from the transistor $Q_{12}$ is either grounded, or applied to the superposing circuit 320 through a resistor $R_{14}$ in response to the operational state of the transistor $Q_{13}$ of the servo read controlling circuit 330.

On the other hand, a recording format on the disk is generally made as shown in FIG. 7A. Symbols RGNA, STC, SGC, P, Q, A and B designate servo information. An area Ts is a servo information interval; and other areas except the servo information interval Ts is a data information interval. Usually, the length of the servo information interval Ts is uniformly set. The servo synchronizing signal SYNSVO is generated for a DC gap and a servo information interval of FIG. 7A as shown in FIG. 7B. The servo synchronizing signal SYNSVO is generated during the servo interval from the detecting point of a DC gap by a DC gap detecting circuit (not shown) of the disk driving apparatus at a normal state.

That is, the servo synchronizing signal SYNSVO is generated from the starting point of the DC gap for a next sector to the end of the servo information interval Ts after having delayed during a period of time from the detecting point of a previous DC gap. Therefore, the servo interval is up to the end point of the servo information interval Ts of the next sector from that of a previous sector. Thus, the servo synchronizing signal SYNSVO is easily generated by the use of a counter, a monostable multivibrator, etc. The format shown in FIG. 7A and the DC gap detecting circuit are disclosed in detail in Korea Patent Application No. 92-22464, assigned to the same assignee of the present invention. Thus, no further description needs to be given.

Now, the operation of the servo read controlling circuit 330 and the superposing circuit 320 according to the servo synchronizing signal SYNSVO is described. Assuming that the head is in a read state of the data information interval of the disk, the servo synchronizing signal SYNSVO is set to a logic "low" state and is applied to the base of the transistor through the resistor $R_{18}$. Then the transistor $Q_{13}$ is turned off. The DC voltage level generated from the transistor $Q_{12}$ is applied to the connecting point between the resistors and $R_{17}$ of the superposing circuit 320 through the resistors $R_{14}$ and $R_{15}$. At this time, a constant DC voltage level is set in the resistors $R_{16}$ and $R_{17}$ by dividing the supply voltage Vcc. Hence, in the connecting point between the resistors $R_{16}$ and $R_{17}$, the DC voltage level applied from the transistor $Q_{12}$ and the fixedly set DC voltage level are superposed and generated as the data detecting level. Next, assuming that the head is in a read state of the servo interval in the disk, the servo synchronizing signal SYNSVO is set to a logic "high" state up to the end point of the servo information interval Ts from that of the previous sector and is applied to the base of the transistor Q__through the resistor $R_{18}$. Then the transistor Q__is turned on and the connecting point between the resistors $R_{14}$ and $R_{15}$ is grounded. Thus the DC voltage level generated from the transistor $O_{12}$ is not applied to the superposing circuit 320 and the data detecting level can be represented by:

$$\frac{\frac{R_{15}}{R_{17}}}{\frac{R_{15}}{R_{17}} + R_{16}} \times Vcc$$

That is, as shown in FIG. 7C a data detecting level for the data information interval is higher than that for the servo interval. Therefore, the data detecting level is differently adjusted with respect to the data information interval and the servo interval.

The reason why the data detecting level is adjusted by dividing the data information interval and the servo interval is because, first, the amplitude of the signal picked up by the head is often different due to different servo and data frequencies when reading the data information and the servo information. Second, it is useful in the disk driving apparatus because of the use of an additional servo recording head that is used when recording servo information applied from a servo writer during a manufacturing process. In the manufacturing process, the disk driving apparatus has the additional servo recording head so that the servo information is recorded by a servo recording head; then when reading the servo information or reading/writing data information, the head used for reading/writing is commonly employed. Therefore, the amplitude of the signal picked up during a reading appears differently at the servo and data information intervals. Third, noise is often created by the DC gap between sectors. Only for different settings of the data detecting level at each disk driving apparatus, the superposing circuit 320 and the servo read controlling circuit 330 may not be used.

Figure 8:
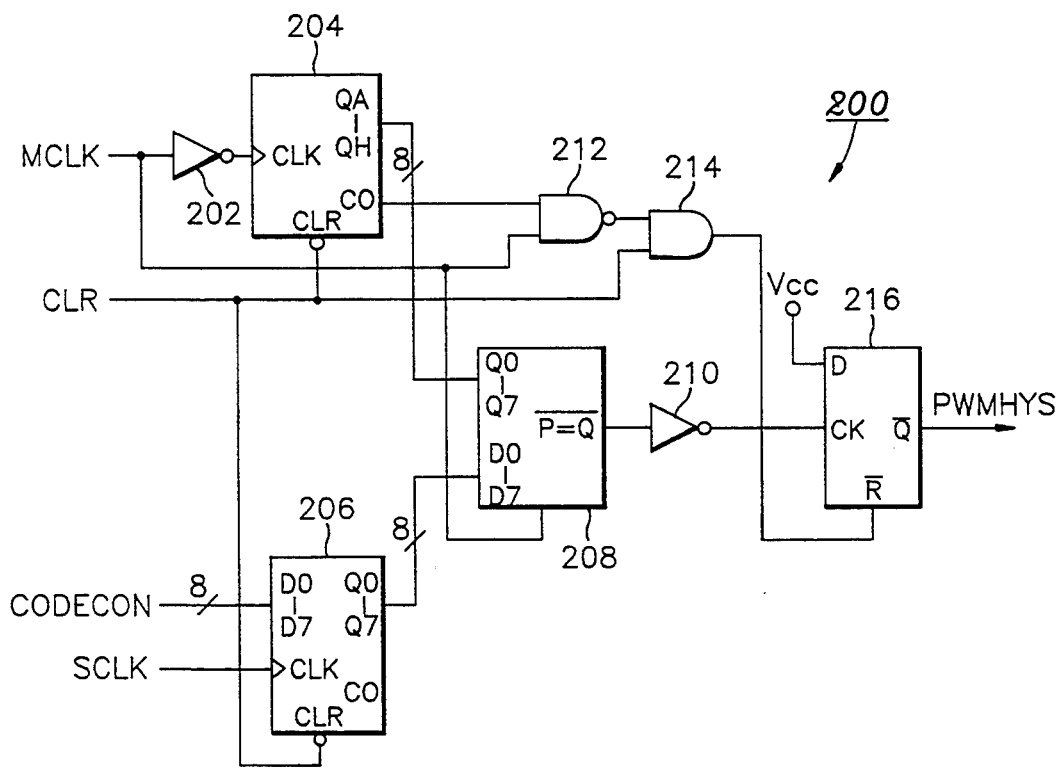
FIG. 8 is a detail circuit diagram of the pulse width modulated signal generating circuit shown in FIG. 5.

Referring to FIG. 8, the level control data CODECON of 8 bits is received and the duty cycle is varied with 256 grades. A latch circuit 206 latches the level control data CODECON received from the controller 100 of FIG. 5. A counter 204 counts the number of pulses of a clock signal MCLK applied through an inverter 202 repeatedly to generate count data and generates a carry signal when the count is ended as a count end signal. The count end signal is applied to a reset terminal "R" of a flip-flop 216 via a NAND gate 212 and an AND gate 214. A comparator circuit 208 compares the level control data CODECON latched to the latch circuit 208 with the count data of the counter 204 and generates a logic "low" state when the level control data CODECON and the count data are the same. The logic "low" signal of the comparator circuit 208 is applied to the clock terminal CK of the flip-flop 216 through an inverter 210. A supply voltage Vcc is applied to a data terminal "D" of the flip-flop 216.

FIGS. 9A to 9G show operational waveforms of each component of the circuit of FIG. 8 in the case that the PWM signal PWMHYS having duty cycle of 50% is generated.

One example of operation of FIG. 8 will now be described with reference to FIGS. 9A to 9G. If the power of the disk driving apparatus is switched on, a clear signal CLR becomes a logic "low" state, and the latch circuit 206, the counter 204 and the flip-flop 216 are initialized. The clock signal MCLK shown in FIG. 9A is applied to a clock terminal CLK of the counter 204 through the inverter 202. The clock signal MCLK utilizes a clock having a constant frequency of 32 MHz used in the disk driving apparatus or an additional clock. The counter 204 counts the number of pulses of the clock signal MCLK repeatedly and provides count data as shown in FIG. 9B to the comparator circuit 208. Whenever the count corresponds to count data FFH, the counter 204 produces the count end signal of a logic "low" state as shown in FIG. 9E. Therefore, a signal indicated in FIG. 9F is applied to the reset terminal R of the flip-flop 216.

Under such a state, if it is desirable for the controller 100 of FIG. 5 to generate the PWM signal PWMHYS having a duty cycle of 50%, a control clock signal SCLK is produced by the control of an address when the level control data CODECON is applied to the latch circuit 206 with count data 80H. The control clock signal SCLK is generated by the chip select address decoding of the controller 100. Then the latch circuit 206 latches the count data 80H and applies the count data 80H to the comparator circuit 208. The comparator circuit 208 compares the level control data CODECON latched to the latch circuit 206 with the count data of the counter 204 and generates a logic "low" signal as shown in FIG. 9C when the the level control data and the count data are the same. Therefore, a signal shown in FIG. 9D is applied to the clock terminal CK of the flip-flop 216. In response to the count end signal of the counter 204, the flip-flop 216 latches a logic "high" caused by the supply voltage Vcc and is reset by the logic "low" signal of the comparator circuit 208. The invert output terminal Q of the flip-flop 216 generates the PWM signal PWMHYS of which a different logical state is alternatively repeated as shown in FIG. 9G. In this case, since a logic "high" interval $T_{D1}$, and a logic "low" interval $T_{D2}$ are identical to each other at one period, the PWM signal PWMHYS has the duty cycle of 50%. If the controller 100 varies the duty cycle of the PWM signal PWMHYS, it is desirable to generate the control clock signal SCLK when the level control data CODECON of a corresponding value is applied to the latch circuit 206.

Consequently, since the data detecting level is variably adjusted by the circuits of FIG. 5 and FIG. 8, the data detecting level adapted for each disk driving apparatus is obtained without modifying its hardwares.

Referring to FIG. 10, one example of processes for adjusting the data detecting level adapted for each disk driving apparatus is shown. The controller 100 set, in step A1, an initial level control value L_SET to a level control value L_HYS in response to a read test mode during a test process. The initial level control value L_SET is predetermined in a read test program of the disk driving apparatus to an intermediate value 80H, for example. In steps A2 to A4, a read test is performed while the level control value L_HYS is incremented by 01H. Further, a maximum level is determined by checking whether or not there is a data error. The maximum level means a maximum value of the data detecting level in which the data error is not generated. The read test is identical to that performed during a manufacturing process of the disk driving apparatus. The controller 100 provides the level control data CODECON having the level control value L_HYS to the PWM signal generating circuit 200, and thus, data is detected in response to the data detecting level adjusted by the PWM signal PWMHYS having the duty corresponding to the level control value L_HYS. If an error occurs, a data detecting level value less than that generating the error by one stage is set to a maximum level value L_MAX, in step A5, and the maximum level value L_MAX is stored in a corresponding register. In steps A6 to A9, the initial level control value L_SET is set to the level control value L_HYS and the read test is performed while the level control value L_HYS is decremented by 01H. Moreover, a minimum level is determined by checking if there is the data error. The minimum level means a minimum value of the data detecting level in which the data error does not occur. The controller 100 provides the level control data CODECON having the level control value L_HYS to the PWM signal generating circuit 200, and thus, data is detected in response to the data detecting level adjusted by the PWM signal PWMHYS having the duty corresponding to the level control value L_HYS. If the error is detected, the data detecting level value greater than that generating the error by one stage is set to a minimum level value L_MIN and the minimum level value L_MIN is stored in a corresponding register. If the maximum and minimum level values L_MAX and L_MIN are determined, an average value of the maximum and minimum level values L_MAX and L_MIN is set to the initial level control value L_SET, and this initial level control value L_SET is recorded in a maintenance cylinder of the disk. When the power of the disk driving apparatus is turned on by a user, the controller 100 reads the initial level control value L_SET recorded in the maintenance cylinder and generates the level control data having the initial level control value L_SET to the PWM signal generating circuit 200, to determine the data detecting level. At this time, the sector or data interval where the error is detected is mapped to the defect list, and therefore, the data error during operation is prevented.

That is, since the initial level control value is appropriately adjusted, the data detecting level adapted for each disk driving apparatus is obtained without either the necessity or inconvenience of modifying hardware.

Referring to FIG. 11, another example of processes for adjusting the data detecting level adapted for each disk driving apparatus is shown. The controller 100 set, in step Bi, the initial level control value L_SET to the level control value L_HYS when the power of the disk driving apparatus is switched on. As described above, the initial level control value L_SET is a value recorded in the maintenance cylinder of the disk by a series of steps of FIG. 10. Steps B2–B10 are identical to steps A2–A10 of FIG. 10, and will therefore not be described in detail. If the maximum and minimum level values $L_{MAX}$ and $L_{MIN}$ are determined, an average value of the maximum and minimum level values L_MAX and L_MIN is set to the level control value L_HYS. Then the level control data having the level control value L_HYS is provided to the PWM signal generating circuit 200, to adjust the data detecting level.

Therefore, the data detecting level is appropriately obtained by adjusting the level control value whenever the power of the disk driving apparatus is turned on. The controller 100 may perform any one or both of the steps shown in FIGS. 10 and 11.

While preferred embodiments of the present invention have been particularly shown and described, it will be understood by those skilled in the art that foregoing and other changes in form and details may be made without departing from the spirit and scope of the present invention. In particular, a microcomputer having a PWM signal generating function can be used in stead of the controller 100 and the PWM signal generating circuit 200. Moreover, since a general hard disk drive has various heads, the data detecting level can be adjusted by differentiating each head or dividing a disk area by the given unit. The present invention is also applicable to a general magnetic recording apparatus detecting data stored in a recording medium. Further, the data detecting level adjusting function shown in FIG. 11 can be performed by the control of a host computer.

As described so far, the data detecting level adapted for each disk driving apparatus can be adjusted without modifying hardware of each disk driving apparatus, and the data error can be prevented by adaptively adjusting the data detecting level to operating circumstances.

I claim:

1. A circuit for generating an adjusted data detecting level in a disk driving apparatus in which a signal picked up from a disk is compared with the adjusted data detecting level for detecting data included in the picked up signal, said circuit comprising:

level controlling means for generating a pulse width modulation signal having a duty cycle corresponding to a predetermined level control value, wherein said level controlling means comprises:

maximum level determining means for performing a read test while a level control value is incremented by a given stage from an initial level control value in response to a test mode, and designating the level control value less than that generating a data error by one stage as a maximum level value;

minimum level determining means for performing said read test while said level control value is decremented by said given stage from said initial level control value, and designating the level control value greater than that generating the data error by one stage as a minimum level value; and control value determining means for designating an average value of said maximum and minimum level values as said predetermined level control value; and level determining means for detecting a voltage level of said pulse width modulation signal generated from said level controlling means and for adjusting said data detecting level by a level corresponding to the detected voltage level to generate said adjusted data detecting level.

2. The circuit as claimed in claim 1, wherein said control value determining means records said predetermined level control value, obtained from said average value of said maximum and minimum level values, in a maintenance cylinder of said disk as said initial value.

3. A circuit for for producing a data detecting level for a disk driving apparatus, said disk driving apparatus comparing a signal picked up from a disk with said data detecting level for detecting data included in the picked up signal, said circuit comprising:

level controlling means for generating a pulse width modulation signal having a duty cycle corresponding to a predetermined level control value, wherein said level controlling means comprises:

maximum level determining means for performing a read test while a level control value is incremented by a given stage from an initial level control value when power is turned on, and designating the data level control value less than that generating a data error by one stage as a maximum level value;

minimum level determining means for performing said read test while said level control value is decremented by said given stage from said initial level control value, and determining the level control value greater than that generating the data error by one stage as a minimum level value; and control value determining means for determining an average value of said maximum and minimum level values and for setting said average value as said predetermined level control value; and level determining means for detecting a voltage level of said pulse width modulation signal generated from said level controlling means and designating a level corresponding to the detected voltage level as said data detecting level.

4. A circuit for adjusting a data detecting level in a disk driving apparatus, said disk driving apparatus comparing a signal picked up from a disk with said data detecting level for detecting data included in the picked up signal, said circuit comprising:

level controlling means for generating a pulse width modulation signal having a duty cycle corresponding to a predetermined level control value; and level determining means for detecting a voltage level of said pulse width modulation signal generated from said level controlling means and determining a level corresponding to the detected voltage level for adjusting said data detecting level, wherein said level determining means comprises:

level detecting means for smoothing said pulse width modulation signal to detect a direct current voltage level; and superposing means for superposing the direct current voltage level detected from said level detecting means with a fixedly predetermined direct current voltage level of said data detecting level for adjusting said data detecting level.

5. A circuit for adjusting a data detecting level in a disk driving apparatus in which a signal picked up from a disk with said data detecting level for detecting data included in the picked up signal, said circuit comprising:

level controlling means for generating a pulse width modulation signal having a duty cycle corresponding to a predetermined level control value, wherein said level controlling means comprises:

controlling means for generating level control data having the predetermined level control value;

latching means for latching said level control data;

counting means for repeatedly counting the number of pulses of a clock signal having a constant frequency for generating count data and for generating a count end signal when the count is ended;

comparing means for comparing said level control data with said count data and generating a given logic signal when said level control data is equal to said count data; and pulse width modulation signal generating means for generating a signal of which a different logic state is alternatively repeated to said pulse width modulation signal in response to said count end signal and said given logic signal; and level determining means for detecting a voltage level of said pulse width modulation signal generated from said level controlling means to adjust said data detecting level by a level corresponding to the detected voltage level.

6. A circuit for adjusting a data detecting level in a disk driving apparatus for comparing a signal picked up from a disk with said data detecting level for detecting data included in the picked up signal, said circuit comprising:

controlling means for generating level control data having a predetermined value;

pulse width modulation signal generating means for generating a pulse width modulation signal having a variable duty corresponding to the value of said level control data;

level detecting means for smoothing said pulse width modulation signal to detect a direct current voltage level;

superposing means for superposing the direct current voltage level detected from said level detecting means with said data detecting level, said data detecting level having a predetermined direct current voltage level, to adjust said data detecting level; and servo read controlling means for cutting off the supply of the direct current voltage level detected from said level detecting means to said superposing means in response to a servo synchronizing signal generated during a servo information interval of said disk, and generating only said predetermined direct current voltage level to said superposing means to provide said data detecting level.

7. The circuit as claimed in claim 6, wherein said pulse width modulation signal generating means comprises:

latching means for latching said level control data;

counting means for repeatedly counting the number of pulses of a clock signal having a constant frequency to generate count data and to generate a count end signal when the count is ended;

comparing means for comparing said level control data with said count data and for generating a given logic signal when said level control data is equal to said count data; and means for generating a signal of which a different logic state is alternatively repeated as said pulse width modulation signal in response to said count end signal and said given logic signal.

8. The circuit as claimed in claim 6, wherein said controlling means is a microcomputer.

9. A method for adjusting a data detecting level in a disk driving apparatus in which a signal picked up from a disk is compared with said data detecting level for detecting data included in the picked up signal, said method comprising the steps of:

a controlling process of generating level control data having a predetermined value;

a pulse width modulation signal generating process of generating a pulse width modulation signal having variable duty corresponding to the predetermined value of said level control data; and a level determining process of smoothing said pulse width modulation signal to detect a direct current voltage level and adjusting said data detecting level in response to the detected direct current voltage level, wherein said level determining process comprises the steps of:

a superposing process of superposing the detected direct current voltage level with said data detecting level, said data detecting level having a fixedly predetermined direct current voltage level, to adjust said data detecting level; and a servo read controlling process of cutting off said detected direct current voltage level in response to a servo synchronizing signal generated during a servo information interval of said disk for generating only said said data detecting level having said predetermined direct current voltage level as said data detecting level to be compared with said picked up signal.

10. A method for adjusting a data detecting level in a disk driving apparatus having means for variably adjusting said data detecting level by a pulse width modulation signal corresponding to a predetermined level control value, wherein said disk driving apparatus compares a signal picked up from a disk with said data detecting level for detecting data included in the picked up signal, said method comprising the steps of:

a maximum level checking process of performing a read test while a level control value is incremented by a given stage from an initial level control value in response to a test mode, and checking whether there is a data error;

a maximum level determining process of designating a level control value less than that generating the data error in said maximum level checking process by one stage as a maximum level value;

a minimum level checking process of performing said read test while said level control value is decremented by said given stage from said initial level control value, and checking whether there is the data error;

a minimum level determining process of designating a level control value greater than that generating the data error in said minimum level checking process by one stage as a minimum level value; and a control level value determining process of determining an average value of said maximum and minimum level values and designating said average value as said predetermined level control value.

11. The method as claimed in claim 10, wherein said control value determining process further comprises the step of recording said predetermined level control value, as said initial level control value in a maintenance cylinder of said disk.

12. A method for adjusting a data detecting level in a disk driving apparatus having means for variably adjusting said data detecting level by a pulse width modulation (PWM) signal corresponding to a predetermined level control value, said disk driving apparatus for comparing a signal picked up from a disk with said data detecting level and detecting data included in the picked up signal, said method comprising the steps of:

a maximum level checking process of performing a read test while a level control value is incremented by a given value from an initial level control value when power is turned on, and checking whether there is a data error;

a maximum level determining process of designating a level control value less than that generating the data error in said maximum level checking process by one said given value as a maximum level value;

a minimum level checking process of performing said read test while said level control value is decremented by said given value from said initial level control value, and checking whether there is the data error;

a minimum level determining process of designating a level control value greater than that generating the data error in said minimum level checking process by one said given value as a minimum level value; and a control value determining process of determining an average value of said maximum and minimum level values and assigning said average value as said predetermined level control value.

13. A circuit for preventing false output when reading data recorded onto a recording medium, comprising:

transducer means for providing an electrical signal upon reading data from said recording medium;

means for providing an amplified signal by amplifying the electrical signal in dependence upon a gain control signal;

means for providing a filtered signal by filtering the amplified signal;

means for generating said gain control signal in dependence upon said filtered signal;

means for detecting peak values of said filtered signal and generating a first pulse signal in dependence upon the peak values;

differential means for differentially comparing said filtered signal with a data detecting level to provide a differential signal;

means for latching the differential signal and producing a second pulse signal representative of an output data; and means for adjusting said data detecting level input to said differential means, said adjusting means comprising:

controller means for generating a level control signal having a predetermined value;

signal generator means for generating a pulse-width-modulated signal having a duty cycle corresponding to the level control signal;

level detector means for detecting a direct current voltage level from said pulse-width-modulated signal;

superpose means for superposing the direct current voltage level with a predetermined direct current voltage level to adjust said data detecting level; and servo read controller means for controlling said superpose means by disabling supply of the direct current voltage level from said level detector means to said superpose means when a servo synchronizing signal is indicative of a servo information interval and enabling generation of only said predetermined direct current voltage level to said superpose means to produce said data detecting level when said servo synchronizing signal is indicative of a data information interval.

14. The circuit as claimed in claim 13, wherein said signal generator means comprises:

latch means for latching said level control signal in dependence upon a first clock signal to provide a latched signal;

counter means for counting a number of pulses of a second clock signal having a constant frequency to provide a counted signal and a count-end signal when the count is ended;

comparator means for making a comparison between said latched signal and said counted signal to generate a compared signal in dependence upon said comparison;

inverter means for inverting said compared signal to provide an inverted signal;

first logic means for logically combining said count-end signal and said second clock signal to provide a first logic signal;

second logic means for logically combining said first logic signal and a clear signal to provide a second logic signal; and flip-flop means for providing said pulse-width-modulated signal having a duty cycle corresponding to said level control signal in response to said inverted signal and said second logic signal.

15. The circuit as claimed in claim 13, wherein said level detector means comprises:

a first transistor having a first electrode of a principal electrically conducting channel coupled to a first voltage potential via a first resistor, a second electrode of said principal electrically conducting channel coupled to a second voltage potential and a control electrode coupled to receive said pulse-width-modulated signal;

a second transistor having a first electrode of a principal electrically conducting channel coupled to said first voltage potential, a second electrode of said principal electrically conducting channel coupled to said second voltage potential via a second resistor and a control electrode connected to said first electrode of said first transistor via a third resistor;

a first capacitor interposed between Said control electrode of said second transistor and said second voltage potential; and a fourth resistor interposed between said second electrode of said second transistor and an output node for providing said direct current voltage level.

16. The circuit as claimed in claim 15, wherein said superpose means comprises:

a fifth resistor interposed between said output node of said level detector means and an output terminal for producing said data detecting level;

a sixth resistor interposed between said output terminal and said first voltage potential;

a seventh resistor interposed between said output terminal and said second voltage potential; and a second capacitor interposed between said output terminal and said second voltage potential.

17. The circuit as claimed in claim 16, wherein said first voltage potential comprises said predetermined direct current voltage level.

* * * * *